(12) United States Patent
Yoshida et al.

(10) Patent No.: US 7,529,077 B2
(45) Date of Patent: May 5, 2009

(54) COMPOSITE ELECTRONIC COMPONENT

(75) Inventors: Kentaro Yoshida, Tokyo (JP); Takahiro Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 5 days.

(21) Appl. No.: 12/003,725

(22) Filed: Dec. 31, 2007

(65) Prior Publication Data

US 2008/0170351 A1   Jul. 17, 2008

(51) Int. Cl.
H01G 4/228 (2006.01)

(52) U.S. Cl. .............. 361/306.3; 361/321.1; 361/306.1; 361/302; 361/305

(58) Field of Classification Search .............. 361/306.3, 361/306.1, 306.2, 321.1, 321.2, 308.1, 301.2, 361/301.4, 302–305
See application file for complete search history.

(56) References Cited

U.S. PATENT DOCUMENTS

| | | | | |
|---|---|---|---|---|
| 6,072,687 | A * | 6/2000 | Naito et al. | 361/303 |
| 6,909,593 | B2 * | 6/2005 | Kuroda et al. | 361/306.3 |
| 7,277,270 | B2 * | 10/2007 | Sato et al. | 361/321.1 |
| 7,411,775 | B2 * | 8/2008 | Togashi | 361/303 |
| 7,468,881 | B2 * | 12/2008 | Sato et al. | 361/306.3 |

FOREIGN PATENT DOCUMENTS

| | | |
|---|---|---|
| JP | A-03-060148 | 3/1991 |
| JP | A-7-220906 | 8/1995 |
| JP | A-09-017643 | 1/1997 |
| JP | A-11-251152 | 9/1999 |
| JP | A-11-317311 | 11/1999 |
| JP | A-2003-51729 | 2/2003 |
| JP | A-2005-64267 | 3/2005 |
| JP | A-2006-13154 | 1/2006 |
| JP | A-2006-41081 | 2/2006 |
| JP | A-2006-41820 | 2/2006 |
| JP | A-2006-115460 | 4/2006 |
| JP | A-2006-140173 | 6/2006 |
| JP | A-2006-310712 | 11/2006 |
| JP | A-2007-500442 | 1/2007 |
| JP | A-2007-194494 | 8/2007 |
| JP | A-2007-195060 | 8/2007 |
| JP | A-2007-227473 | 9/2007 |

* cited by examiner

Primary Examiner—Nguyen T Ha
(74) Attorney, Agent, or Firm—Oliff & Berridge, PLC

(57) ABSTRACT

A composite electronic component has: a first multilayer section including an electrode layer; and a second multilayer section laid on the first multilayer section and including at least one ground electrode layer on which a ground electrode is formed, and at least one hot electrode layer on which a hot electrode is formed. In the second multilayer section, the hot electrode layer is interposed between the ground electrode layer nearest to the first multilayer section, and the first multilayer section and in the ground electrode on the ground electrode layer nearest to the first multilayer section, at least a part of an exposed portion exposed from the hot electrode to the first multilayer section side is a narrow portion narrower than a width of an unexposed portion not exposed therefrom.

8 Claims, 6 Drawing Sheets

Fig.3
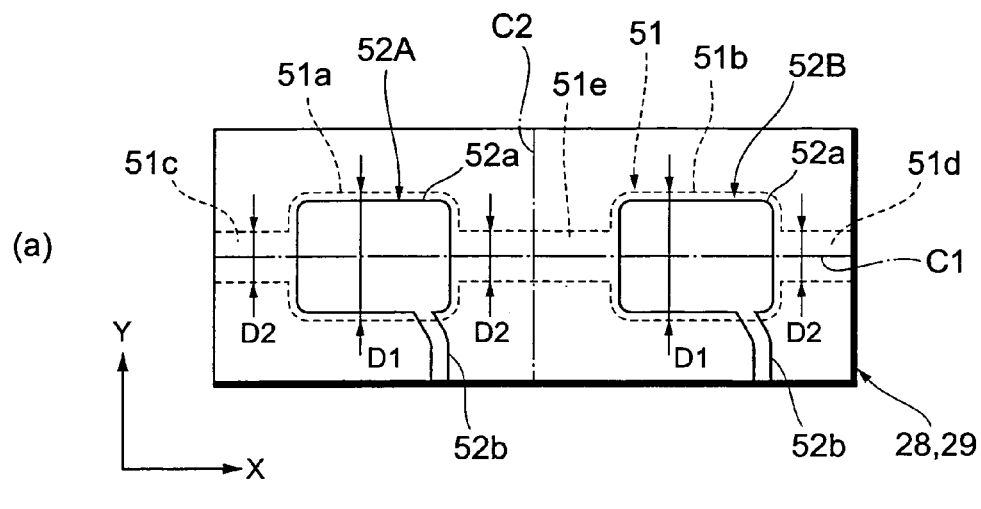
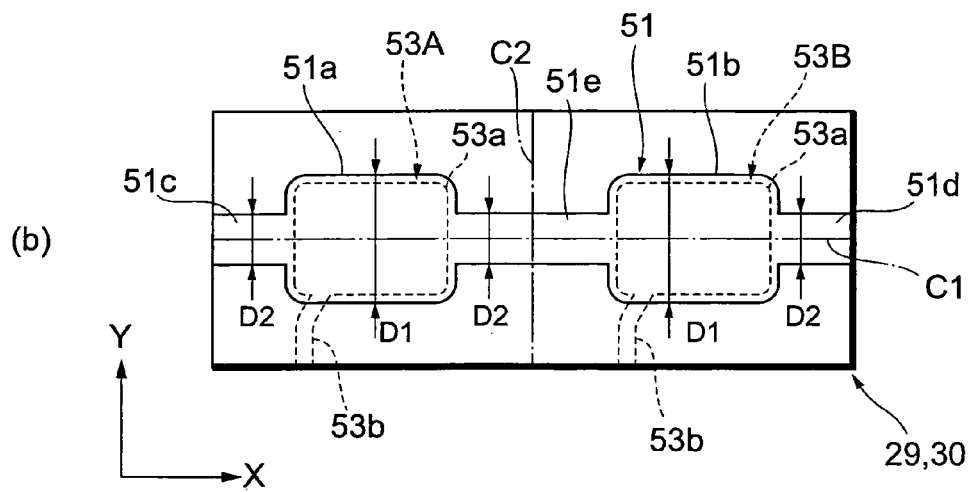

Fig.5
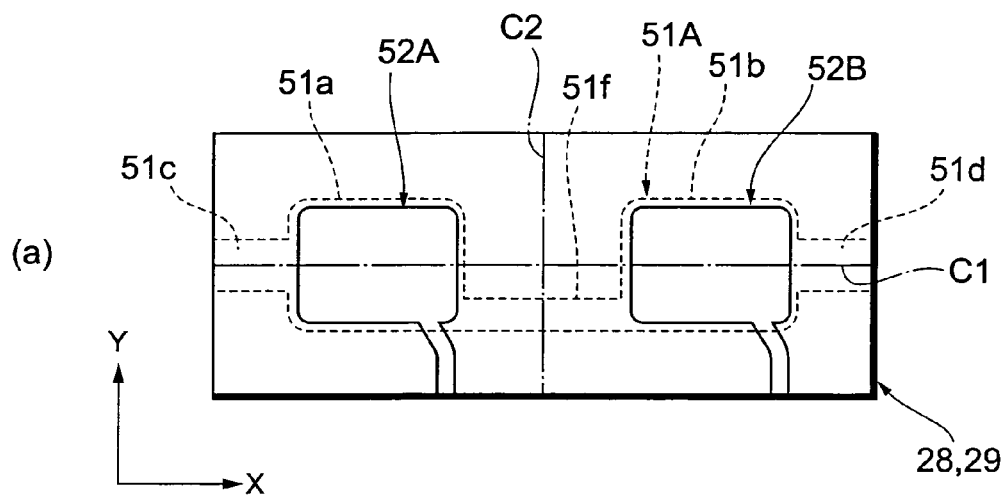
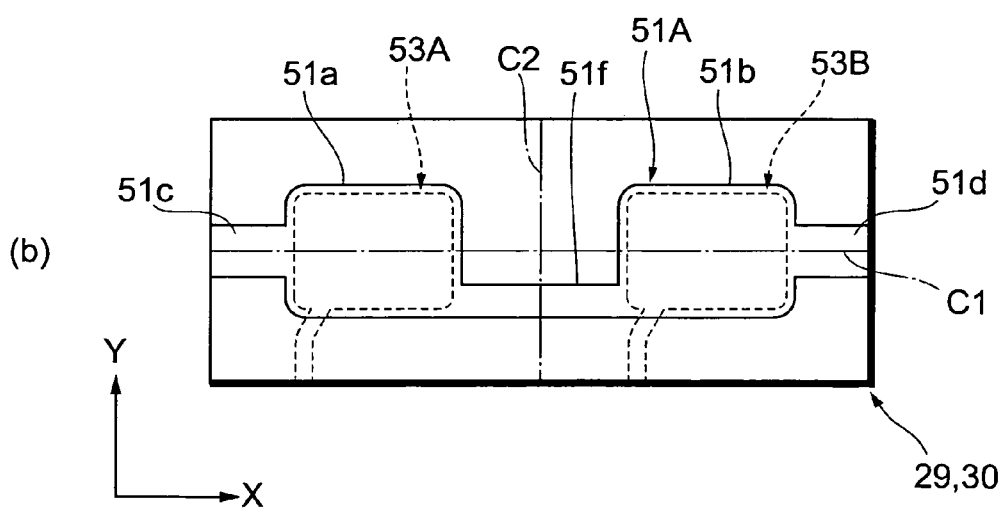

Fig.6
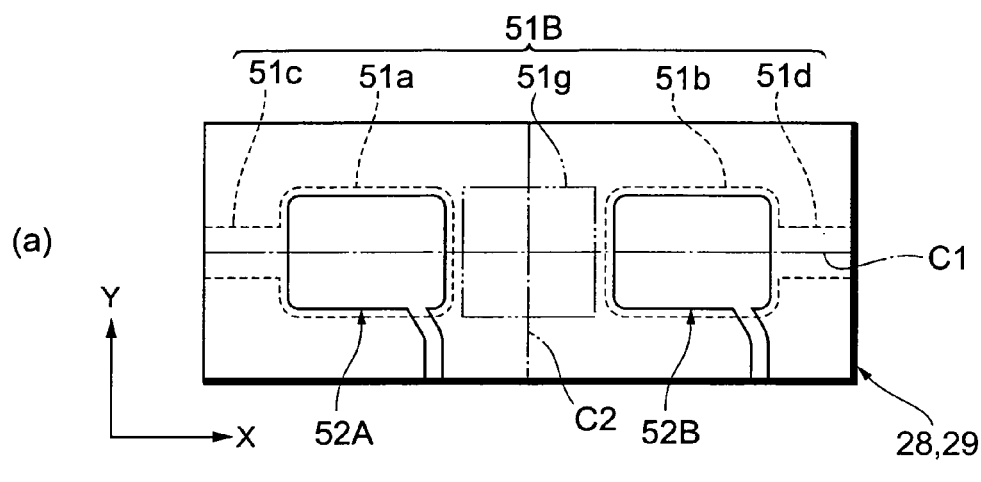
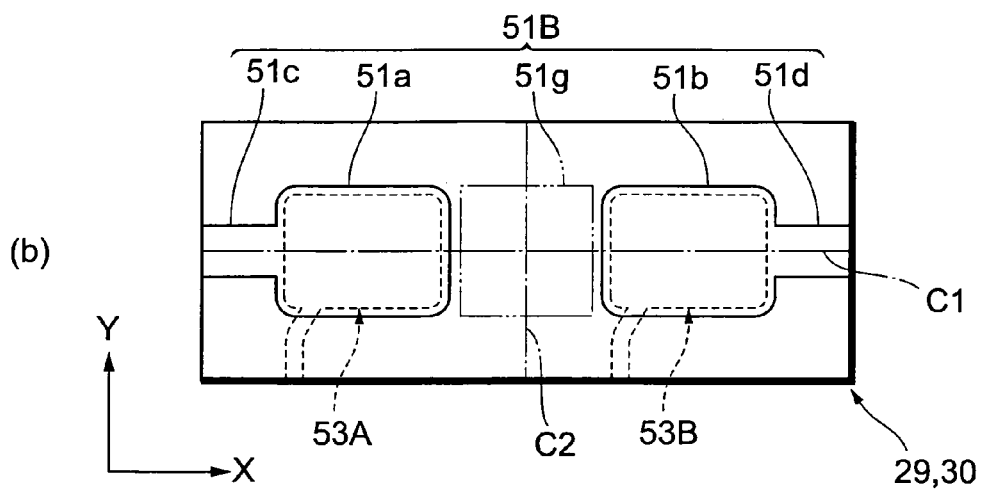

COMPOSITE ELECTRONIC COMPONENT

BACKGROUND OF THE INVENTION

1. Field of the Invention

The present invention relates to a multilayer composite electronic component.

2. Related Background Art

A conventional composite electronic component in the field of this technology is disclosed, for example, in Japanese Patent Application Laid-open No. 2005-64267. The composite electronic component described in this application consists of a stack of an inductor section and a capacitor section and the capacitor section is composed of two ground electrode layers and one hot electrode layer interposed between them.

SUMMARY OF THE INVENTION

However, the conventional composite electronic component described above had a problem of stray capacitance as described below. Since the ground electrode layer in the capacitor section was located on the inductor section side with respect to the hot electrode layer, a relatively large stray capacitance was produced between this ground electrode layer and the inductor section.

In order to avoid this problem, the inventors attempted to locate the hot electrode layer on the inductor section side with respect to the ground electrode layer. However, the attempt failed to sufficiently reduce the stray capacitance between the ground electrode and the inductor section (first multilayer section).

Therefore, the present invention has been accomplished in order to solve the above-discussed problem and an object of the invention is to provide a composite electronic component capable of further reducing the stray capacitance.

A composite electronic component according to the present invention is a composite electronic component comprising: a first multilayer section comprising an electrode layer; and a second multilayer section laid on the first multilayer section and comprising at least one ground electrode layer on which a ground electrode is formed, and at least one hot electrode layer on which a hot electrode is formed; wherein in the second multilayer section, the hot electrode layer is interposed between the ground electrode layer nearest to the first multilayer section, and the first multilayer section and in the ground electrode on the ground electrode layer nearest to the first multilayer section, at least a part of an exposed portion exposed from the hot electrode to the first multilayer section side is a narrow portion narrower than a width of an unexposed portion not exposed therefrom.

In this composite electronic component, the hot electrode layer is interposed between the ground electrode layer and the first multilayer section. For this reason, the stray capacitance produced between the ground electrode on the ground electrode layer and the electrode layer in the first multilayer section is reduced by the hot electrode on the hot electrode layer. In addition, at least a part of the exposed portion of the ground electrode is the narrow portion, so as to reduce the area of the exposed portion, whereby the stray capacitance is effectively reduced.

The composite electronic component may be constructed in a configuration wherein the first multilayer section is an inductor section in which an inductor is formed. In this case, the composite electronic component according to the present invention becomes an L-type electronic component.

The composite electronic component may be constructed in a configuration wherein a plurality of hot electrodes are formed on the hot electrode layer and wherein the narrow portion of the ground electrode is disposed between two hot electrodes adjacent to each other.

The composite electronic component may be constructed in a configuration wherein the ground electrode has a linearly extending shape and the narrow portion is disposed on a virtual line connecting the two end portions of the ground electrode.

The composite electronic component may be constructed in a configuration wherein a width of the narrow portion of the ground electrode is not more than a width of the two end portions of the ground electrode.

The present invention successfully provides the composite electronic component capable of further reducing the stray capacitance.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 3 is plan views of stacked functional layers.

FIG. 5 is plan views showing a ground electrode in a configuration different from that in the foregoing embodiment.

FIG. 6 is plan views showing a ground electrode in a configuration different from that in the foregoing embodiment.

DESCRIPTION OF THE PREFERRED EMBODIMENTS

A mode believed to be the best for carrying out the present invention will be described below in detail with reference to the accompanying drawings. Identical or equivalent elements will be denoted by the same reference symbols and the description thereof will be omitted in the case of redundant description.

Figure 1:
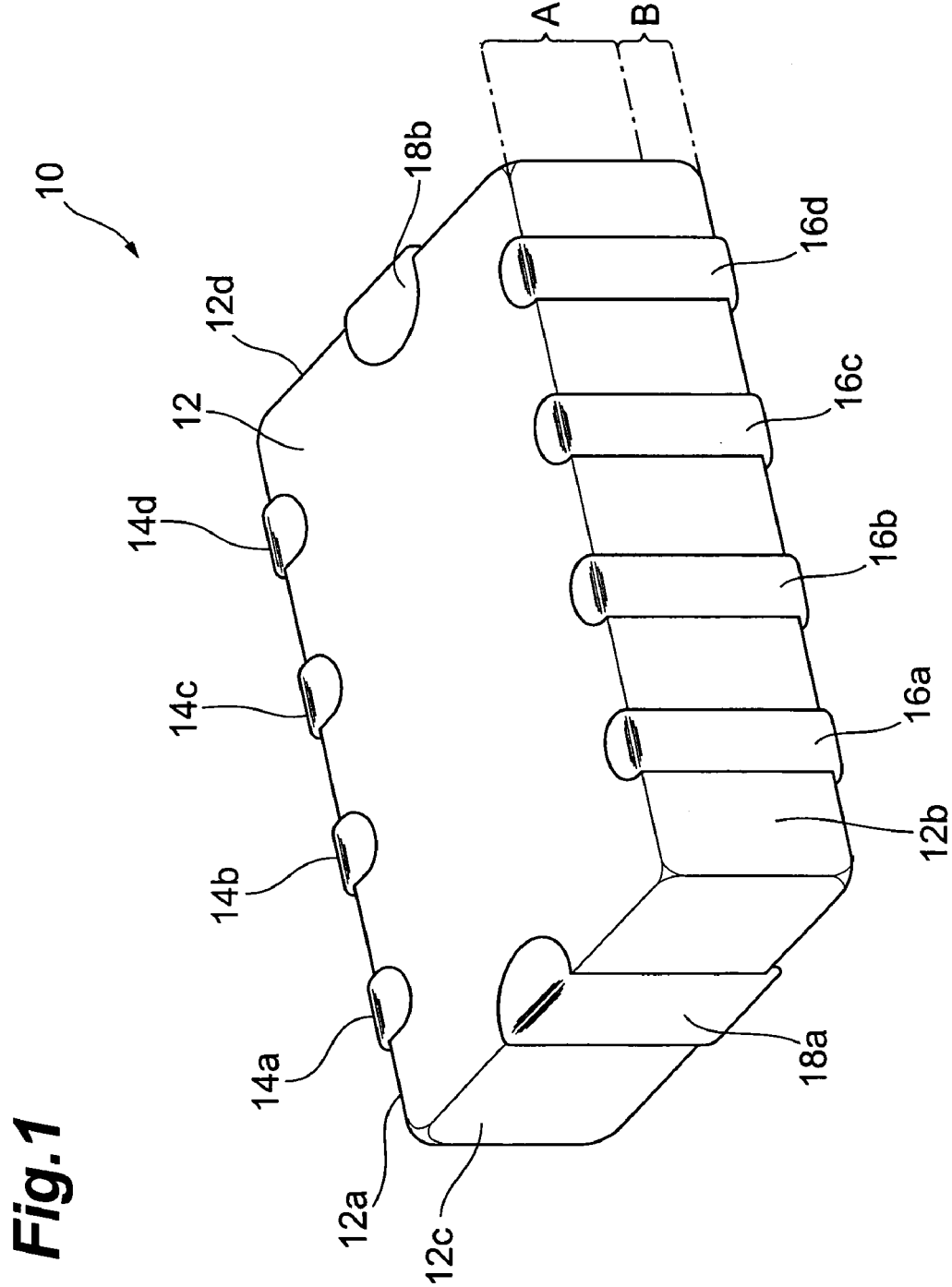
FIG. 1 is a perspective view showing a composite electronic component according to an embodiment of the present invention.

The description will be given below using an example of a multilayer filter (length 2.0 mm×width 1.0 mm×thickness 0.7 mm) as a composite electronic component according to the present invention. FIG. 1 is a perspective view showing the composite electronic component 10 according to an embodiment of the present invention. The composite electronic component 10 shown in FIG. 1 is a multilayer filter array component in which four L-type filter elements each composed of an inductor and a varistor are disposed in parallel. The composite electronic component 10 is comprised of an element body 12 of a nearly rectangular parallelepiped shape, four pairs of terminal electrodes 14a, 16a, 14b, 16b, 14c, 16c, and 14d, 16d, and a pair of ground terminal electrodes 18a, 18b.

The terminal electrodes 14a, 14b, 14c, 14d are disposed in order on a first face 12a being a side face of the element body 12 and each terminal electrode has a shape extending in a stack direction of the element body 12. Likewise, the terminal electrodes 16a, 16b, 16c, 16d are disposed in order on a second face 12b being a side face opposite to the first face 12a with respect to the element body 12, and each terminal electrode has a shape extending in the stack direction of the element body 12. Each set of terminal electrode 14a, 14b, 14c, or 14d and terminal electrode 16a, 16b, 16c, or 16d constitute a pair of terminal electrodes and are disposed on the exterior of the element body 12 so as to face each other.

The ground terminal electrode 18a is disposed on a central region of a third face 12c being a side face perpendicular to the first face 12a and the second face 12b with respect to the element body 12, and has a shape extending in the stack direction of the element body 12. Likewise, the ground terminal electrode 18b is disposed on a central region of a fourth face 12d being a side face opposite to the third face 12c with respect to the element body 12, and has a shape extending in the stack direction of the element body 12. The ground terminal electrode 18a and the ground terminal electrode 18b constitute a pair of ground terminal electrodes and are disposed on the exterior of the element body 12 so as to face each other.

A plurality of functional layers are stacked in the element body 12 and the element body 12 has a first multilayer section (inductor section) A and a second multilayer section (varistor section) B along the stack direction of these functional layers. The functional layers with mutually different functions are stacked in the first multilayer section A and in the second multilayer section B in the element body 12. The configuration of the element body 12 will be described below in detail.

Figure 2:
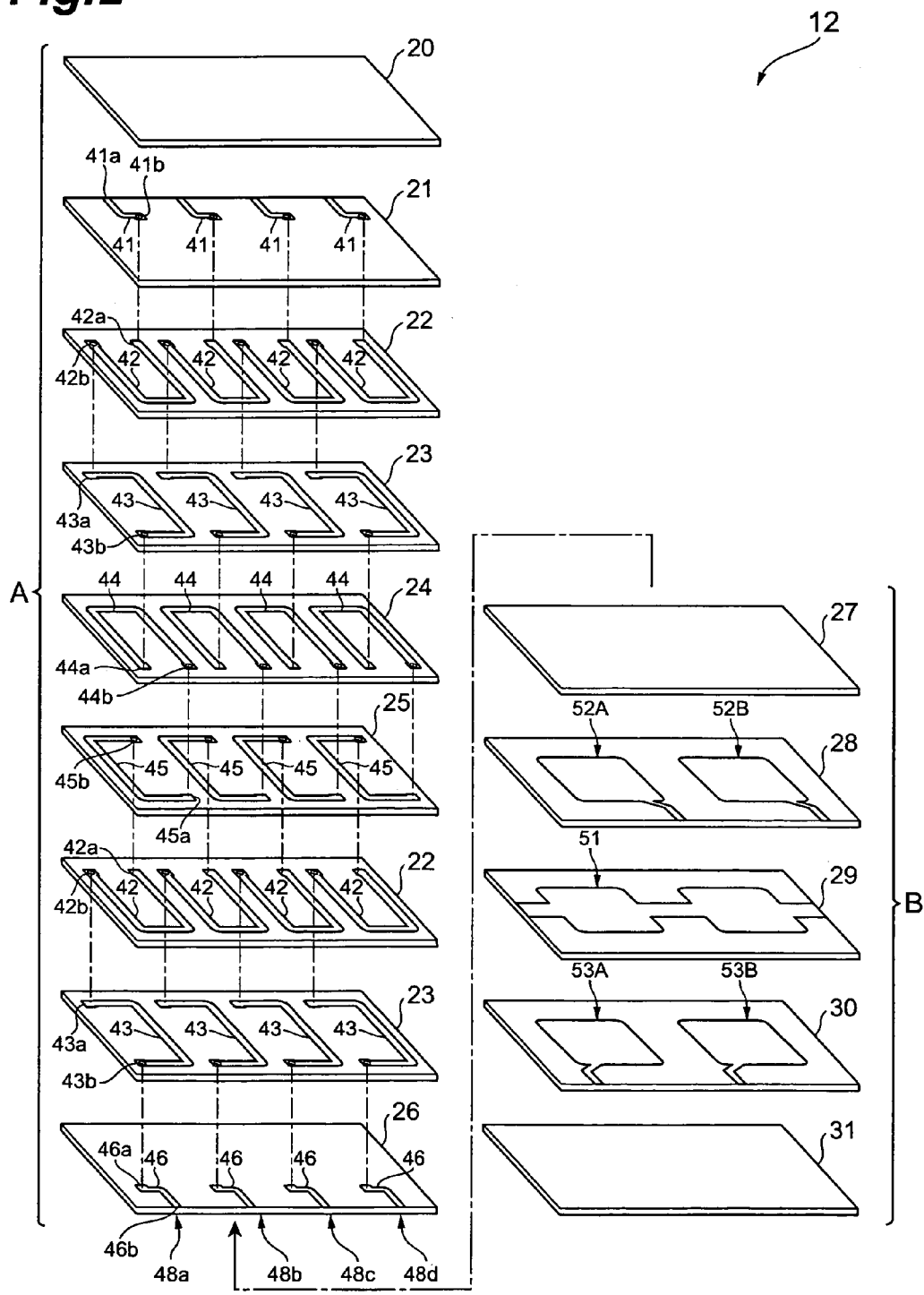
FIG. 2 is an exploded perspective of the composite electronic component shown in FIG. 1.

FIG. 2 is an exploded perspective view showing the separated layers of the element body shown in FIG. 1. A plurality of functional layers 20, 21, 22, 23, 24, 25, 22, 23, 26 are stacked in order in the first multilayer section A of the element body 12. Each of the functional layers 20-26 has the thickness of about 20 μm and is made of an electrically insulating material. For example, a ceramic material consisting mainly of ZnO is applicable to the material of the functional layers 20-26. The ceramic material making the functional layers may contain metal elements such as Pr, K, Na, Cs, and Rb as additives, in addition to ZnO. A magnetic material such as ferrite can also be used as a constituent material of each functional layer 20-26.

A plurality of functional layers 27, 28, 29, 30, and 31 are stacked in order in the second multilayer section B of the element body 12. Each of the functional layers 27-31 has the thickness of about 60 μm and is made of a dielectric material. In the present embodiment the functional layers 27-31 are made of a dielectric material that exhibits a nonlinear current-voltage characteristic. For example, a ceramic material consisting mainly of ZnO is applicable to the material of the functional layers 20-26. This ceramic material further contains at least one element selected from the group consisting of Pr and Bi, Co, and Al as additives.

Since the functional layers 27-31 contain Co in addition to Pr, they have an excellent nonlinear current-voltage characteristic and high permittivity ($\in$). Since they further contain Al, they have a low resistance. In order to further improve the characteristics, the functional layers 27-31 may further contain any metal element or the like (e.g., Cr, Ca, Si, K, etc.) other than the above-described elements, as an additive.

In the practical element body 12, the functional layers 20-26 and the functional layers 27-31 are integrally formed so that no boundary can be visually recognized between the layers.

The configuration of the first multilayer section A of the element body 12 will be described below in detail. A set of four conductor patterns 41, 42, 43, 44, 45, 42, 43, or 46 consisting mainly of palladium are disposed on one principal face of each of the plurality of functional layers (electrode layers in the present invention) 21, 22, 23, 24, 25, 22, 23, and 26. The four conductor patterns 41 are juxtaposed in the facing direction of the pair of ground terminal electrodes 18a-18b which is a direction perpendicular to the stack direction of the functional layers 20-26. Similarly, each set of four conductor patterns 42-46 are also juxtaposed in the facing direction of the pair of ground terminal electrodes 18a-18b.

The conductor patterns 41, 46 are provided as leads to the terminal electrodes, and the conductor patterns 42-45 are made in a coil shape in order to increase the inductance. In other words, each of the conductor patterns 42-45 has a U-shape formed along sides of a nearly rectangular shape.

One ends 41a of the four conductor patterns 41 are located each along one edge of the functional layer 21 forming a part of the first face 12a shown in FIG. 1 and are connected to the respective terminal electrodes 14a, 14b, 14c, and 14d shown in FIG. 1. The other ends 41b of the four conductor patterns 41 are connected through through-hole conductors to respective one ends 42a of the four conductor patterns 42. The other ends 42b of the four conductor patterns 42 are connected through through-hole conductors to respective one ends 43a of the four conductor patterns 43 and the other ends 43b of the four conductor patterns 43 are connected through through-hole conductors to respective one ends 44a of the four conductor patterns 44. The other ends 44b of the four conductor patterns 44 are connected through through-hole conductors to respective one ends 45a of the four conductor patterns 45 and the other ends 45b of the four conductor patterns 45 are connected through through-hole conductors to respective one ends 42a of the four conductor patterns 42.

The other ends 42b of the four conductor patterns 42 are connected through through-hole conductors to respective one ends 43a of the four conductor patterns 43 and the other ends 43b of the four conductor patterns 43 are connected through through-hole conductors to respective one ends 46a of the four conductor patterns 46. The other ends 46b of the four conductor patterns 46 are located each along one edge of the functional layer 26 forming a part of the second face 12b shown in FIG. 1 and are connected to the respective terminal electrodes 16a, 16b, 16c, and 16d shown in FIG. 1

As described above, the conductor patterns 42-46 adjacent in the stack direction of the element body 12 are connected in series in each set to form four inductor conductors 48a, 48b, 48c, and 48d.

The configuration of the second multilayer section B of the element body 12 will be described below in detail. As described above, the second multilayer section B is composed of the five functional layers 27-31. A ground electrode 51 is formed by pattern printing on a principal face of the functional layer 29 located in the middle among the five functional layers 27-31. Two hot electrodes 52A, 52B; 53A, 53B are formed by pattern printing on a principal face of each of the two functional layers 28, 30 adjacent above and below to the functional layer 29. The ground electrode 51 is separated by about 50 μm after baked, from the hot electrodes 52A, 52B, 53A, 53B.

The functional layer 29 with the ground electrode 51 thereon will be referred to hereinafter as a ground electrode layer, for convenience' sake of description. Among the functional layers 28, 30 with the hot electrodes 52A, 52B, 53A, 53B thereon, the functional layer 28 on the first multilayer section A side with respect to the ground electrode layer 29 will be referred to as a first hot electrode layer 28 and the other functional layer 30 as a second hot electrode layer.

The shapes of the above-described ground electrode 51 and hot electrodes 52A, 52B, 53A, 53B and positional relationship among them will be described below with reference to FIG. 3. FIG. 3 is plan views of the stacked functional layers. In FIG. 3, (a) is a plan view showing a state in which the first hot electrode layer 28 and the ground electrode layer 29 are stacked, and in FIG. 3, (b) is a plan view showing a state in which the ground electrode layer 29 and the second hot electrode layer 30 are stacked.

As shown in FIG. 3 (a), the two hot electrodes 52A, 52B on the first hot electrode layer 28 have the same shape and each of them is composed of a capacitive electrode portion 52a and a lead electrode portion 52b.

Each capacitive electrode portion 52a of the two hot electrodes 52A, 52B formed on the first hot electrode layer 28 has the same shape, and is of a nearly rectangular shape extending along the longitudinal direction (X-direction in FIG. 3) of the first hot electrode layer 28, and the four corners thereof are curvilinearly chamfered. These two capacitive electrode portions 52a are arranged in juxtaposition along a center line C1 of the first hot electrode layer 28 extending in the X-direction and each of them is arranged in symmetry with respect to the center line C1. The two capacitive electrode portions 52a are also arrayed in symmetry with respect to a center line C2 of the first hot electrode layer 28 extending in the transverse direction (Y-direction in FIG. 3) of the first hot electrode layer 28. Namely, the two capacitive electrode portions 52a of the first hot electrode layer 28 have the symmetrical shape with respect to the center line C1 and are arranged in symmetry with respect to the center line C2.

Each lead electrode portion 52b of the hot electrodes 52A, 52B is a portion of a uniform-width line shape extending from the corresponding capacitive electrode portion 52a to the edge corresponding to the second face 12b of the element body 12, and is once obliquely led out and then extends along the Y-direction to the edge to be electrically connected to the terminal electrode 16b or 16d formed on the second face 12b.

The ground electrode 51 on the ground electrode layer 29 is composed of two main body portions 51a, 51b juxtaposed in the X-direction, a pair of end portions 51c, 51d extending along the X-direction from the main body portions 51a, 51b to the two edges, and a connection portion extending along the X-direction between the main body portions 51a, 51b.

Each of the main body portions 51a, 51b is formed in a shape nearly identical with the capacitive electrode portion 52a, in a region corresponding to the capacitive electrode portion 52a of the hot electrodes 52A, 52B described above. The main body portions 51a, 51b are of a nearly rectangular shape extending along the longitudinal direction (X-direction in FIG. 3) of the ground electrode layer 29 and are juxtaposed along the center line C1 extending in the X-direction. The main body portions 51a, 51b have a symmetrical shape with respect to the center line C1 and are arranged in symmetry with respect to the center line C2. For this reason, the capacitive electrode portions 52a of the hot electrodes 52A, 52B are superposed over the corresponding main body portions 51a, 51b of the ground electrode 51. The width in the Y-direction of the main body portions 51a, 51b is D1.

The end portions 51c, 51d are arranged in juxtaposition on the center line C1 on both sides of the main body portions 51a, 51b and are portions of a rectangular shape extending along the X-direction from the main body portions 51a, 51b to the two edges of the ground electrode layer 29. The end portions 51c, 51d function as lead electrode portions to lead the electrode from the main body portions 51a, 51b to the third face 12c and the fourth face 12d of the element body 12. The end portion 51c is electrically connected to the ground terminal electrode 18a formed on the third face 12c, and the end portion 51d is electrically connected to the ground terminal electrode 18b formed on the fourth face 12d. The width in the Y-direction of the two end portions 51c, 51d is D2 smaller than D1.

The connection portion 51e is interposed between the pair of main body portions 51a, 51b on the center line C1 and is a portion of a rectangular shape extending along the X-direction between the main body portion 51a and the main body portion 51b. Namely, the connection portion 51e electrically connects the two main body portions 51a, 51b with each other. The width in the Y-direction of this connection portion 51e is the same D2 as that of the aforementioned end portions 51c, 51d.

As described above, the ground electrode 51 on the ground electrode layer 29 has the linearly extending shape (rectangular shape) and the connection portion 51e is located on the center line (virtual line) C1 connecting the two end portions 51c, 51d.

As shown in FIG. 3 (b), the two hot electrodes 53A, 53B on the second hot electrode layer 30 have the same shape, as in the case of the first hot electrode layer 28, and each of them is composed of a capacitive electrode portion 53a and a lead electrode portion 53b.

Each capacitive electrode portion 53a of the two hot electrodes 53A, 53B formed on the second hot electrode layer 30 has the same shape as that of the capacitive electrode portion 52a of the hot electrodes 52A, 52B on the first hot electrode layer 28. Each of the hot electrodes 53A, 53B is of a nearly rectangular shape extending along the longitudinal direction (X-direction in FIG. 3) of the second hot electrode layer 30 and the four corners thereof are curvilinearly chamfered. These two capacitive electrode portions 53a are juxtaposed along the center line C1 of the second hot electrode layer 30 extending in the X-direction and are arranged each in symmetry with respect to this center line C1. The two capacitive electrode portions 53a are also arrayed in symmetry with respect to the center line C2 of the second hot electrode layer 30 extending in the transverse direction (Y-direction in FIG. 3) of the second hot electrode layer 30. Namely, the two capacitive electrode portions 53a of the second hot electrode layer 30 have a symmetrical shape with respect to the center line C1 and are arranged in symmetry with respect to the center line C2.

Each lead electrode portion 53b of the hot electrodes 53A, 53B is a portion of a uniform-width line shape extending from the corresponding capacitive electrode portion 53a to the edge corresponding to the second face 12b of the element body 12, and is once obliquely led out and then extends along the Y-direction to the edge to be electrically connected to the terminal electrode 16a or 16c formed on the second face 12b.

Figure 4:
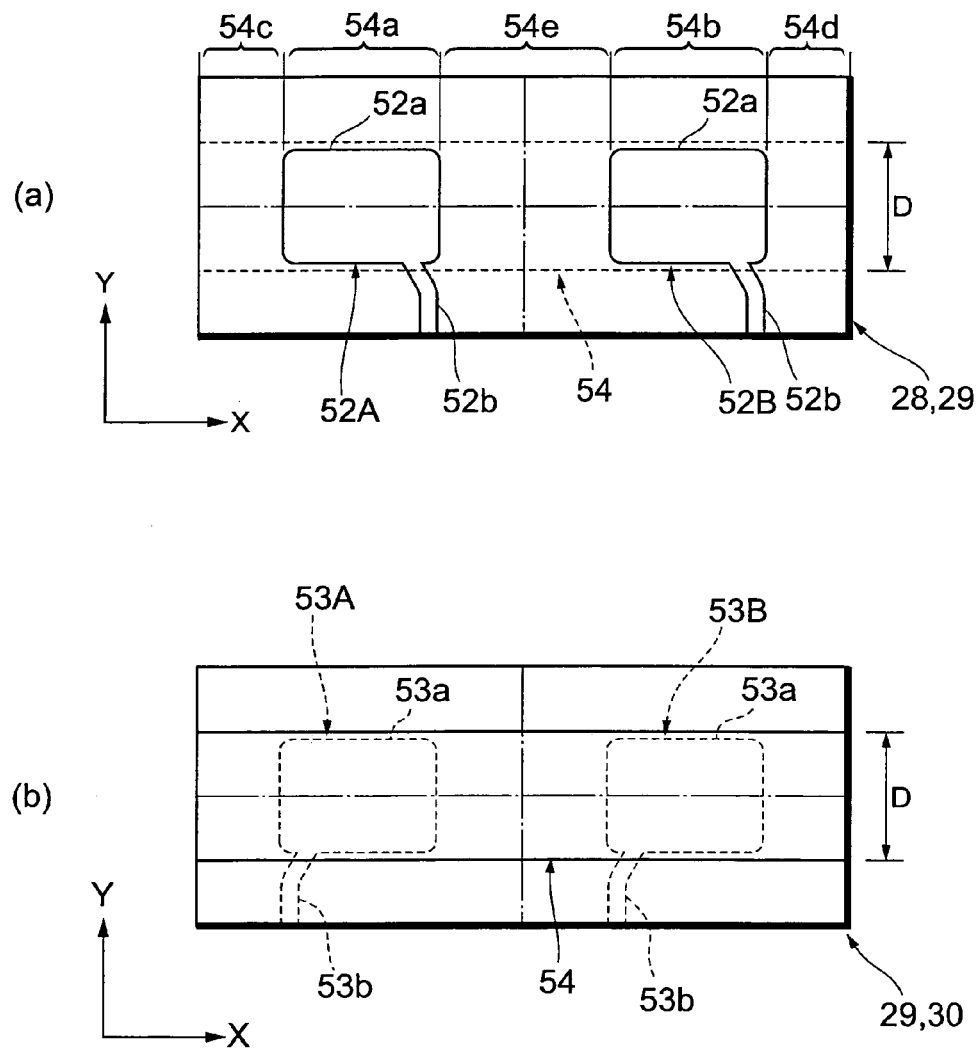
FIG. 4 is plan views showing stacked states of parts of a varistor section in a composite electronic component at the experimental stage.

Now, let us explain the positional relationship between the hot electrodes and the ground electrode in the second multilayer section of the composite electronic component at the experimental stage before accomplishment of the present invention by the inventors, with reference to FIG. 4. FIG. 4 is plan views showing stacked states of parts of the second multilayer section B in the composite electronic component at the experimental stage. In FIG. 4 numeral 54 denotes the ground electrode at the experimental stage formed on the ground electrode layer 29.

As shown in FIG. 4, the ground electrode 54 at the experimental stage has a rectangular shape extending in a uniform width D in the X-direction. Namely, the ground electrode 54 is constructed in the same width of regions 54a, 54b corresponding to the hot electrodes 52A, 52B on the first hot electrode layer 28, regions 54c, 54d outside the hot electrodes 52A, 52B, and a region 54e between the hot electrodes 52A, 52B.

The inventors conducted extensive and intensive research on the problem that a relatively large stray capacitance was made between the ground electrode 54 of this shape and the electrode layers 21, 22, 23, 24, 25, 22, 23, 26 of the first multilayer section A, and finally came to find the ground electrode 51 as in the present embodiment. Namely, the inventors came to find that the ground electrode 54 at the experimental stage had the large area of the exposed portions of the ground electrode 54 exposed from the hot electrodes 52A, 52B to the first multilayer section A side (i.e., the region 54c, the region 54d, and the region 54e) and this resulted in producing the large stray capacitance between the exposed portions 54c, 54d, 54e and the first multilayer section A, and then discovered the ground electrode 51 in which the width of the exposed portions 54c, 54d, 54e was smaller than the width of the unexposed portions (i.e., the region 54a and the region 54b) not exposed.

In other words, the aforementioned ground electrode 51 is so constructed that the exposed portions (the two end portions 51c, 51d and the connection portion 51e) exposed from the hot electrodes 52A, 52B to the first multilayer section A side are narrow portions narrower than the width of the unexposed portions (main body portions 51a, 51b) not exposed therefrom. For this reason, the width D2 of the two end portions 51c, 51d and the connection portion 51e corresponding to the narrow portions of the exposed portions is smaller than the width D1 of the main body portions 51a, 51b corresponding to the unexposed portions.

When the ground electrode 51 is provided with such narrow portions 51c, 51d, 51e, the area of the ground electrode 51 exposed from the hot electrodes 52A, 52B to the first multilayer section A side (i.e., directly facing the inductor conductors 48a, 48b, 48c, 48d of the first multilayer section A) is significantly reduced, so as to effectively reduce the stray capacitance.

Furthermore, the inventors showed by the result of the following experiment that the above-described reduction of the stray capacitance suppressed variation in the capacitances in the varistor section of the four filter elements in the composite electronic component 10.

The experiment was conducted as follows: the electronic components prepared were electronic component #1 equivalent to the composite electronic component with the second multilayer section having the arrangement relation shown in FIG. 3, and electronic component #2 equivalent to the composite electronic component with the second multilayer section having the arrangement relation shown in FIG. 4, and the capacitances between the hot electrodes and the ground electrode of these electronic components #1, #2 (length 2.0 mm×width 1.0 mm×thickness 0.7 mm (the thickness of the second multilayer section: 0.5 mm)) were measured as CH1-CH4. The dielectric material making the varistor section of the electronic components #1, #2, adopted herein, was a material containing $ZnO$, $Pr_6O_{11}$, $CoO$, $Cr_2O_3$, $CaCO_3$, $SiO_2$, $K_2CO_3$, and $Al_2O_3$ (the permittivity: 456). The size of the capacitive electrode portions of the hot electrodes in each electronic component was 0.6 mm (length in the longitudinal direction of the electronic component)×0.35 mm (length in the transverse direction of the electronic component).

The measurement result was as listed in Table 1 below. CH1, CH2, CH3, and CH4 of the electronic component #1 in Table 1 correspond to the capacitances of the hot electrodes 52A, 52B, 53A, 53B, respectively, shown in FIG. 3. CH1, CH2, CH3, and CH4 of the electronic component #2 in Table 1 correspond to the capacitances of the hot electrodes 52A, 52B, 53A, 53B, respectively, shown in FIG. 4.

TABLE 1

| ELECTRONIC COMPONENT #1 | CAPACITANCE (pF) | ELECTRONIC COMPONENT #2 | CAPACITANCE (pF) |
| --- | --- | --- | --- |
| CH1 | 22.3 | CH1 | 22.3 |
| CH2 | 22.9 | CH2 | 28.2 |
| CH3 | 23.2 | CH3 | 27.8 |
| CH4 | 22.5 | CH4 | 22.5 |

As seen from this Table 1, the capacitances of CH1-CH4 are approximately equal to each other in the electronic component #1. In the electronic component #2, the capacitances of CH2 and CH3 are larger than the other two CHs among CH1-CH4.

It is believed from this result that the capacitances are made uniform in the electronic component #1 because of the reduction in the area of the exposed portions of the ground electrode, whereas there is variation in the capacitances in the electronic component #2 because no reduction is made in the area of the exposed portions of the ground electrode.

In the above-described composite electronic component 10, as detailed above, the ground electrode 51 of the second multilayer section B is provided with the narrow portions 51c, 51d, 51e whereby the area of the ground electrode 51 exposed from the hot electrodes 52A, 52B to the first multilayer section A side is significantly reduced, so as to effectively reduce the stray capacitance.

Since the stray capacitance is more significantly affected by the ground electrode layer nearest to the first multilayer section A, it is necessary to provide at least the ground electrode on the ground electrode layer nearest to the first multilayer section A, with the narrow portions 51c, 51d, 51e, in cases where the second multilayer section B includes a plurality of ground electrode layers 29.

The width of the narrow portions 51c, 51d, 51e can be optionally increased or decreased within the range of widths narrower than the main body portions 51a, 51b. If the width of the connection portion 51e among the narrow portions 51c, 51d, 51e is set to be not more than the width of the two end portions 51c, 51d, the area of the exposed portions can be reduced more effectively, whereby a further reduction of the stray capacitance can be realized.

The present invention is not limited to the above embodiment, but can be modified in many ways. For example, the connection portion of the ground electrode does not always have to be disposed on the virtual line connecting the two end portions, but the position of the connection portion of the ground electrode can be moved in the Y-direction as shown in FIG. 5. Namely, in the ground electrode 51A shown in FIG. 5, the connection portion 51f connecting the main body portion 51a and the main body portion 51b lies along one edge of the main body portions 51a, 51b. In other words, when the connection portion 51f is compared with the connection portion 51e of the ground electrode 51 described above, the position thereof in the Y-direction is changed in the downward direction of FIG. 5. The composite electronic component with the ground electrode layer 29 having the ground electrode 51A is also able to achieve the reduction of the stray capacitance for the above-described reason, as the composite electronic component 10 was.

It is also possible to adopt the ground electrode 51B having a blank portion 51g as a narrow portion, as shown in FIG. 6. Namely, in the ground electrode 51B shown in FIG. 6, patterned portions are only the main body portions 51a, 51b and the end portions 51c, 51d of the above-described ground electrode 51, and the blank portion 51g not patterned is formed between the main body portion 51a and the main body portion 51b. The composite electronic component with the ground electrode layer 29 having the ground electrode 51B is also able to realize the reduction of the stray capacitance for the above-described reason, as the composite electronic component 10 was. Particularly, since the ground electrode 51B has no exposed portion in the part corresponding to the connection portion 51e of the ground electrode 51, the reduction of the stray capacitance can be more effectively achieved.

The present invention is not limited to the above embodiments, but can be modified in various ways. For example, the composite electronic components described above were only the L-type multilayer filters, but they may also be modified into π-type multilayer filters as occasion may demand. The above composite electronic components were described as filters with the varistor function, but can also be applied as filters with a capacitor function (LC filters).

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A composite electronic component comprising:
   a first multilayer section comprising an electrode layer; and
   a second multilayer section laid on the first multilayer section and comprising at least one ground electrode layer on which a ground electrode is formed, and at least one hot electrode layer on which a hot electrode is formed;
   wherein in the second multilayer section, the hot electrode layer is interposed between the ground electrode layer nearest to the first multilayer section, and the first multilayer section and in the ground electrode on the ground electrode layer nearest to the first multilayer section, at least a part of an exposed portion exposed from the hot electrode to the first multilayer section side is a narrow portion narrower than a width of an unexposed portion not exposed therefrom.

2. The composite electronic component according to claim 1, wherein the first multilayer section is an inductor section in which an inductor is formed.

3. The composite electronic component according to claim 2, wherein a plurality of said hot electrodes are formed on the hot electrode layer, and
   wherein the narrow portion of the ground electrode is disposed between two said hot electrodes adjacent to each other.

4. The composite electronic component according to claim 3, wherein the ground electrode has a linearly extending shape and the narrow portion is disposed on a virtual line connecting the two end portions of the ground electrode.

5. The composite electronic component according to claim 4, wherein a width of the narrow portion of the ground electrode is not more than a width of the two end portions of the ground electrode.

6. The composite electronic component according to claim 1, wherein a plurality of said hot electrodes are formed on the hot electrode layer, and
   wherein the narrow portion of the ground electrode is disposed between two said hot electrodes adjacent to each other.

7. The composite electronic component according to claim 6, wherein the ground electrode has a linearly extending shape and the narrow portion is disposed on a virtual line connecting the two end portions of the ground electrode.

8. The composite electronic component according to claim 7, wherein a width of the narrow portion of the ground electrode is not more than a width of the two end portions of the ground electrode.

* * * * *

UNITED STATES PATENT AND TRADEMARK OFFICE
CERTIFICATE OF CORRECTION

PATENT NO. : 7,529,077 B2  
APPLICATION NO. : 12/003725  
DATED : May 5, 2009  
INVENTOR(S) : Kentaro Yoshida et al.

Page 1 of 1

It is certified that error appears in the above-identified patent and that said Letters Patent is hereby corrected as shown below:

Title page, column 1, Item (30), please insert the Foreign Application Priority Data:

Item -- (30)   Foreign Application Priority Data

January 12, 2007   (JP) .................2007-004903 --

Signed and Sealed this

Twentieth Day of October, 2009

David J. Kappos
*Director of the United States Patent and Trademark Office*